(12) United States Patent
Ren et al.

(10) Patent No.: US 9,327,313 B2
(45) Date of Patent: May 3, 2016

(54) METHOD AND APPARATUS FOR ACQUIRING NANOSTRUCTURED COATING BY EFFECT OF LASER-INDUCED CONTINUOUS EXPLOSION SHOCK WAVE

(75) Inventors: Xudong Ren, Jiangsu (CN); Shouqi Yuan, Zhenjiang (CN); Cheng Wang, Xi'an (CN); Yongzhuo Huangfu, Jiangsu (CN); Liang Ruan, Jiangsu (CN); Yongkang Zhang, Jiangsu (CN); Naifei Ren, Zhenjiang (CN); Yinghong Li, Xi'an (CN); Weifang He, Xi'an (CN); Fengze Dai, Jiangsu (CN); Tian Zhang, Jiangsu (CN)

(73) Assignee: JIANGSU UNIVERSITY (CN)

( * ) Notice: Subject to any disclaimer, the term of this patent is extended or adjusted under 35 U.S.C. 154(b) by 267 days.

(21) Appl. No.: 14/239,153

(22) PCT Filed: Jul. 28, 2011

(86) PCT No.: PCT/CN2011/077734
§ 371 (c)(1),
(2), (4) Date: Feb. 17, 2014

(87) PCT Pub. No.: WO2012/151790
PCT Pub. Date: Nov. 15, 2012

(65) Prior Publication Data
US 2014/0205764 A1  Jul. 24, 2014

(30) Foreign Application Priority Data

May 11, 2011  (CN) .......................... 2011 1 0120822

(51) Int. Cl.
| H05H 1/00 | (2006.01) |
| B05D 3/14 | (2006.01) |
| C23C 24/08 | (2006.01) |
| C23C 14/28 | (2006.01) |

(52) U.S. Cl.
CPC ................ *B05D 3/148* (2013.01); *C23C 14/28* (2013.01); *C23C 24/082* (2013.01)

(58) Field of Classification Search
CPC ....... B05D 3/148; C23C 14/28; C23C 14/082
See application file for complete search history.

(56) References Cited

U.S. PATENT DOCUMENTS

| 3,756,344 A | * | 9/1973 | Daiber .................. H01S 3/0007 |
| | | | 181/0.5 |
| 6,713,716 B1 | | 3/2004 | Lawrence et al. |
| 2006/0006158 A1 | | 1/2006 | Lawrence et al. |

OTHER PUBLICATIONS

PCT/CN2011/077734 International File Date: Jul. 28, 2011—International Search Report; Jiangsu University; 2 pages.
PCT/CN2011/077734 International File Date: Jul. 28, 2011—Written Opinion; Jiangsu University; 5 pages.
PCT/CN2011/077734 International File Date: Jul. 28, 2011—International Preliminary Report on Patentability; Jiangsu University; 6 pages.

* cited by examiner

*Primary Examiner* — Michael Wieczorek
(74) *Attorney, Agent, or Firm* — Schmeiser, Olsen & Watts, LLP

(57) ABSTRACT

A method and apparatus for acquiring a nanostructured coating on a metal surface by using an intense shock wave generated by continuous explosion of a laser-induced plasma is provided. The method comprises: irradiating a laser beam on a black paint surface of an upper opening of a high pressure resistant glass pipe having a black paint strip arranged therein; the black paint absorbing the light energy and producing a plasma; generating an initial plasma explosion shock wave; transmitting the initial plasma explosion shock wave in the high pressure resistant glass pipe; generating a plasma cloud reaching a lower opening of a glass catheter; and, the shock wave pressure outputted embedding nanoparticles into a surface of a workpiece. The apparatus comprises the high pressure-resistant glass pipe with a zigzagging switchback shape or a spiral and inverted cone shape.

2 Claims, 2 Drawing Sheets

METHOD AND APPARATUS FOR ACQUIRING NANOSTRUCTURED COATING BY EFFECT OF LASER-INDUCED CONTINUOUS EXPLOSION SHOCK WAVE

FIELD OF TECHNOLOGY

The following relates to the technical field of laser technology and surface strengthening, particularly to a method and apparatus for acquiring a nanostructured coating by effect of a laser-induced continuous explosion shock wave.

BACKGROUND

Various damages to materials are often resulted from, for example, corrosion, abrasion, oxidation, fatigue rupture and the like on the surface of the materials. The structure and characteristics of surface materials have a significant influence on the comprehensive performance of the materials. The preparation of a nanostructured surface with a certain thickness on the surface of materials may improve the overall mechanical property and service behavior in various environments of the materials. There are three major ways of acquiring a nanostructured surface on a metal surface: surface coating or deposition, surface self-nanocrystallization and hybrid nanocrystallization.

Surface coating or deposition: the prepared particles in nanometer are solidified on a surface of materials so that a nanostructured surface with identical or different chemical components is formed on the surface of the substrate materials. At present, the common coating and deposition methods include Physical Vapor Deposition (PVD), Chemical Vapor Deposition (CVD), sputtering, electroplating, electrolytic deposition, etc. The key point of such technologies is to achieve firm combination between nanoparticles on the surface and a substrate. Patent Application CN100362128C, filed by Donghua University and entitled "Method and Apparatus for Depositing Nanoparticle Film by Atmosphere Flat Discharge CVD", employed an atmosphere flat discharge method to uniformly deposit a nanoparticle film with identical components and a certain crystallization characteristic on surfaces of various materials. However, this method has disadvantages of high temperature of the substrate materials, low deposition rate, difficult local deposition on the substrate materials, and the generation of harmful gas during the deposition. Patent Application CN101298677, filed by Jilin University and entitled "Preparation of Wear-resistant and Corrosion-resistant Nano-composite Plating Layer on Magnesium Alloy Surface", prepared a nano-composite plating layer on a magnesium alloy surface by placing a chemically-plated magnesium alloy sample into nano-composite plating solution and then performing electrodeposition nanocomposite plating. However, the plating layer has a non-uniform thickness, the technological process is relatively complicated, and the preparation of multiple kinds of chemical solution is required and thus the process is not clean enough.

For conventional laser shock, an intense laser beam with high power density and short pulse is employed to shock a metal surface, and the coating on the metal surface absorbs the laser energy to result in vaporization, ionization and expanding explosion and then forms a plasma shock wave transmitting to the metal inside. However, the shock force generated by a general process is insufficient to embed nanoparticles into the metal surface.

SUMMARY

By a method for acquiring a nanostructured coating disclosed by the present disclosure, the disadvantages mentioned above may be overcome, and a nanostructured coating may be obtained simply and quickly with remarkable effect and little pollution. Here, a continuous explosion shock wave induced by an intense laser beam with high power density and short pulse is utilized to embed powdery nanoparticles into a surface of metal materials, so that a dense nanostructured protection layer is formed on the surface. Hence, the corrosion resistance, abrasion resistance, oxidation resistance and fatigue life of the materials are improved. Compared with a conventional laser shock strengthening technology, a high pressure resistant glass pipe designed in the method may realize chain explosion of a black paint plasma, so that the rate and size of an explosion wave may be improved significantly.

In embodiments of the present invention, a high pressure resistant glass pipe is designed to induce an energy absorption material to perform chain ionization and explosion to generate an explosion wave, and to constrain the diffusion and attenuation of the explosion wave. The high pressure resistant glass pipe is made from K9 glass and is in a zigzagging switchback shape, and the switchback locations thereof are round right-angle corners. The inner diameter of an upper opening of the pipe is the same as that of the pulse laser spot. As the spot is adjustable, the high pressure resistant glass pipe is designed in a series of specifications: the inner diameter of the lower opening of the pipe is 3 mm less than that of the upper opening thereof; the upper end of the pipe is closed while the lower end thereof is open; the thickness of the pipe is 6 mm; and, the total length of the pipe is 40 mm. If the pipe is too long, the shock wave has a large attenuation; however, if the pipe is too short, the chain explosion shock wave can not have a required value. The inner wall of the pipe is a laser reflector for reflecting the laser beam which is not absorbed by the energy absorption material, so that the loss of energy is avoided. The reflective mirror at each corner reflects the laser beam to provide intermediate energy support for the chain explosion process. The reflector on the inner wall of the pipe is coated with a layer of energy absorption material (black paint, aluminum powder, etc.) strip, to ensure that each switchback location is coated with the energy absorption material. The glass pipe is encapsulated within a rectangular glass box, to be clamped conveniently by a manipulator.

When the intense laser beam with high power density and short pulse shocks the surface of the energy absorption coating at the upper opening of the high pressure resistant glass pipe, the coating particles absorb a part of energy of the high-energy laser beam to result in instantaneous vaporization, breakdown and ionization and then generate a plasma. Radiated by the subsequent laser beam, the plasma quickly accumulates energy and initiates expanding explosion to form an initial plasma explosion shock wave which is to be transmitted in the high pressure resistant glass pipe. With quite high temperature and energy, the generated plasma excites and induces adjacent coating particles to have the same process of vaporization by combustion, ionization and expanding explosion. The high-energy laser beam not absorbed is reflected onto the coating by the inner wall of the high pressure resistant glass pipe to vaporize and ionize the coating material, thereby providing energy support for the continuous chain explosion. This process is repeated along the energy absorption coating strip on the inner wall of the high pressure resistant glass pipe all the time, whereby a plasma cloud is formed. The explosion shock waves are continuously superimposed layer upon layer; furthermore, as the reaction time is extremely short (nanosecond), the attenuation of the shock wave is relatively small. The shock wave pressure at the lower opening jumps apparently (up to $10^3$-$10^5$ GPa). The high pressure resistant glass pipe plays a role of enhancing the shock wave pressure. The intense shock wave formed during the chain explosion process embeds nanoparticles into a surface of an alloy material thus to form a nanoparticle coating. At the same moment of acquiring a nanoparticle coating, the peak pressure of the shock wave reaching the workpiece is higher than a dynamic yield strength of the metal material, so a strong plastic strain and a high density dislocation occur on the surface and there is a large residual pressure stress generated on the surface, thus the anti-fatigue performance of the material is improved effectively.

An apparatus disclosed by the present invention comprises: a high-power laser device, a three-degree-of-freedom manipulator, an infrared location calibrator, a 45° full-reflector, focusing lenses, an upper workpiece locating and clamping block, a workpiece, a controller for the workpiece clamping device, a lateral workpiece locating and clamping block, an X/Y-axis workpiece support plate, a workbench, a computer and a high pressure resistant glass pipe. The computer controls the laser device, the X/Y-axis workpiece support plate and the three-degree-of-freedom manipulator. The manipulator is located on the workbench. The high pressure resistant glass pipe is clamped by the manipulator. The upper end of the glass pipe is closed, while the lower end thereof is an inverted conical opening. The workpiece clamping device controller controls the movement and application of force of the workpiece locating and clamping block.

The oxide layer on the surface of a workpiece is worn out with pieces of abrasive paper, while oil stains on the surface of the workpiece are cleaned with absolute alcohol. The workpiece is installed and clamped on the workpiece support plate capable of moving in the X-axis and Y-axis. A surface to be processed of the workpiece is uniformly coated with nanopowders via a metal powder binder, and then dried naturally. The high pressure resistant glass pipe is formed with a black paint strip on the inner wall and bottom of the upper opening via a flexible rubber tape with a cotton top, dried naturally and then clamped on the three-degree-of-freedom manipulator. The infrared locator is turned on, and the manipulator is moved horizontally so that the infrared light irradiates on the black paint at the upper opening of the high pressure resistant glass pipe; then, the X/Y-axis workpiece support plate is moved so that the lower opening of the high pressure resistant glass pipe is aligned to a region to be processed; subsequently, the manipulator is moved vertically so that a distance from the lower opening of the high pressure resistant glass pipe to the surface to be processed is 5-15 mm; and finally, the workpiece support plate is fixed, and the manipulator is locked. The laser device is activated, the parameters such as power density of laser, spot diameter, energy and pulse width are set, and the shock is performed for three times; and the single-point shock and overlapping shock may be performed at different positions by moving the workpiece support plate. At the end of shock, the workpiece is taken down, polished properly and cleaned.

The present invention has the following advantages:
1. due to a spiral high pressure resistant glass pipe, the present invention may obtain a more intense explosion shock wave than a common black paint coating on the basis of chain explosion, vaporization, ionization, and shock wave transmission and superposition principle;
2. compared with a deposition method or a method for electroplating nanoparticles to a substrate material, the method disclosed by the present invention has simple technological process and high processing speed, and may embed nanoparticles into a surface of the substrate material quickly;
3. without using any chemical substances other than black paint, the process is a clean, environmentally-friendly and green processing method;
4. with respect to other methods, the method disclosed by the present invention belongs to cold processing or is approximate to cold processing for the substrate material, so some performances of the workpiece will not be influenced due to high temperature; and
5. at the same moment of acquiring a nanoparticle coating, the peak pressure of the shock wave reaching the workpiece is higher than a dynamic yield strength of the metal material, so a strong plastic strain and a high density dislocation occur under the effect of high strain rate and there is a large residual pressure stress generated on the surface, thus the fatigue rupture resistant performance of the material is improved significantly.

BRIEF DESCRIPTION

Figure 1:
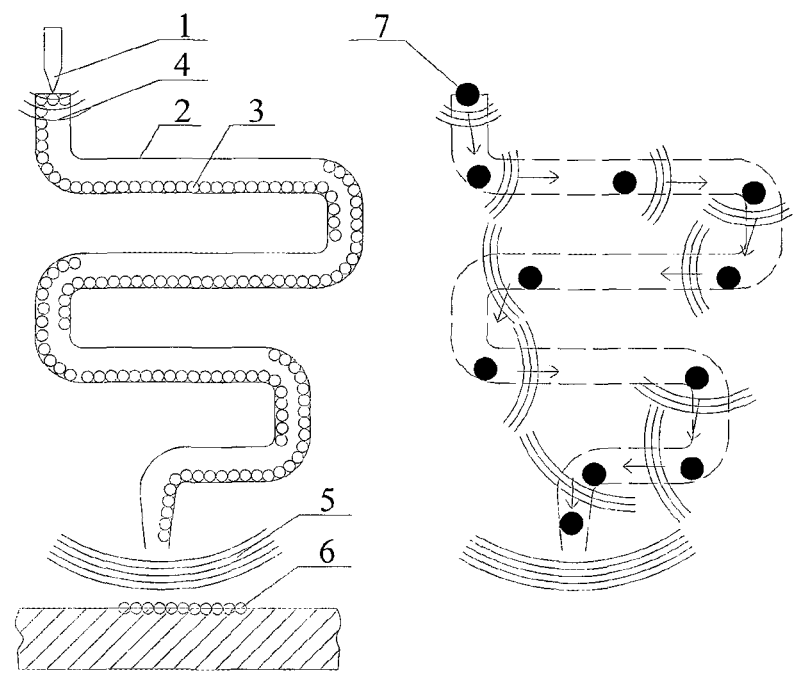
FIG. 1 is a schematic diagram showing a process and principle of forming a laser-induced shock wave.

In the drawings: 1—Laser beam; 2—Laser reflective mirror (inner surface); 3—Black paint strip; 4—Initial explosion shock wave; 5—Final explosion shock wave; 6—Powdery nanoparticles; 7—Black paint particles; 8—High-power laser device; 9—Three-degree-of-freedom manipulator; 10—Infrared location calibrator; 11—Laser beam; 12—45° full-reflector; 13—Focusing lens; 14—Upper workpiece locating and clamping block; 15—Workpiece; 16—Controller for the workpiece clamping device; 17—Lateral workpiece locating and clamping block; 18—X/Y-axis workpiece support plate; 19—Workbench; 20—Computer; 21—High pressure resistant glass pipe; and, 22—Nanopowder on a surface of a pre-coated workpiece.

DETAILED DESCRIPTION

The following contents are just embodiments of the present invention, and are not intended to limit the present invention. The present invention comprises a control system, a light guiding system, a workbench control system and an auxiliary system. The details and working conditions of a specific apparatus provided by the present invention will be described in details as below with reference to the accompanying drawings.

The process and principle of forming a continuous laser-induced explosion shock wave is as shown in FIG. 1. An intense laser beam 1 with high power density and short pulse is irradiated on a black paint surface of an upper opening of a high pressure resistant glass pipe 21. Black paint particles 7 absorb laser energy to result in instantaneous vaporization, breakdown and ionization and then generate a plasma. Radiated by the subsequent laser beam, the plasma quickly accumulates energy and initiates expanding explosion to form an initial plasma explosion shock wave 4 which is to be transmitted in the high pressure resistant glass pipe 21. The high pressure resistant glass pipe 21 is in a zigzagging switchback shape, and the switchback locations thereof are round right-angle corners. The high-temperature and high-energy plasma quickly excites and induces adjacent black paint particles to have the same process of instantaneous vaporization, ionization and expansion to generate a shock wave again. This process is repeated along a black paint strip all the time, whereby a plasma cloud is formed. The explosion shock waves are continuously superimposed layer upon layer, and the shock wave pressure 5 reaching the lower opening jumps apparently. In this process, the reaction time is extremely short, and the attenuation of the shock wave is small. The high pressure resistant glass pipe plays a role of enhancing the shock wave pressure. The intense shock wave 5 formed during the chain explosion process is output from the lower opening to embed nanoparticles into a surface of the alloy material thus to form a nanoparticle coating. At the same moment of acquiring a nanoparticle coating, the peak pressure of the shock wave reaching the workpiece is higher than a dynamic yield strength of the metal material, so a strong plastic strain and a high density dislocation occur on the surface and there is a large residual pressure stress generated on the surface, thus the anti-fatigue performance of the material is improved significantly.

Figure 2:
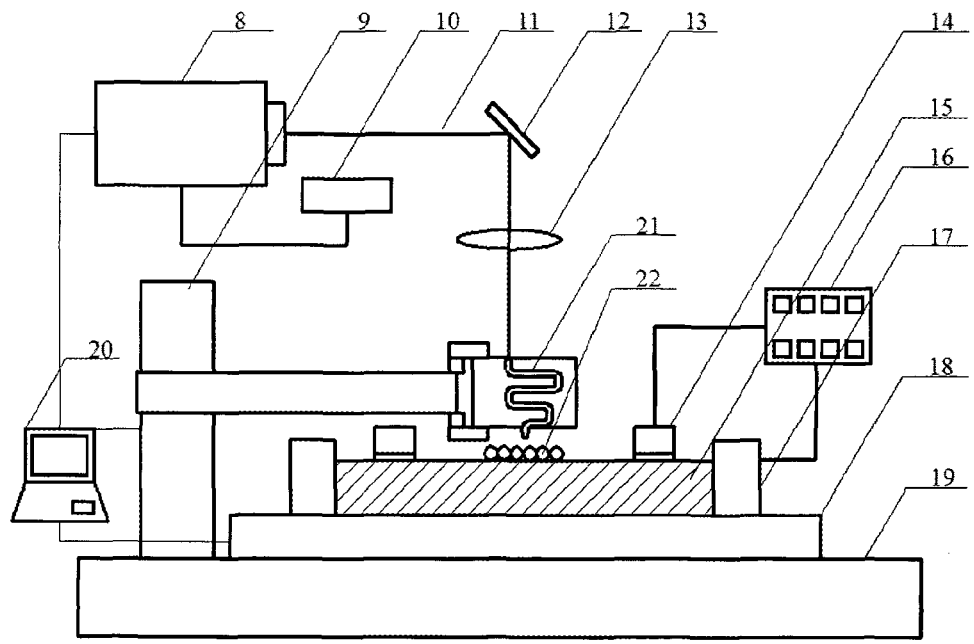
FIG. 2 is a diagram showing an apparatus for preparing a surface nanostructured coating.

As shown in FIG. 2, an apparatus for implementing the method disclosed by the present invention to acquire a nanostructured coating on a material surface and a specific implementation method thereof are provided: a surface to be treated of a workpiece 16 is de-rusted and polished with pieces of abrasive paper, and then de-oiled and cleaned with absolute alcohol; the workpiece is installed and clamped on a workpiece support plate 18 capable of moving in the X-axis and Y-axis; the surface to be processed of the workpiece is uniformly coated with nanopowders via a metal powder binder, and then dried naturally; a black paint strip is formed on the inner wall and bottom of the upper opening of a high pressure resistant glass pipe via a flexible rubber tape with a cotton top, dried naturally, and then clamped on a three-degree-of-freedom manipulator 9; an infrared locator 10 is turned on, and the manipulator is moved horizontally so that the infrared light irradiates on the black paint at the upper opening of the high pressure resistant glass pipe; then, the X/Y-axis workpiece support plate is moved so that the lower opening of the high pressure resistant glass pipe 21 is aligned to a region to be processed; subsequently, the manipulator is moved vertically so that a distance from the lower opening of the high pressure resistant glass pipe to the surface to be processed is 5-15 mm; and finally, the workpiece support plate is fixed, and the manipulator is locked. A laser device is activated, and the parameters such as power density of laser, spot diameter, energy and pulse width are set. The excited laser beam 11 is reflected onto the black paint of the upper opening of the high pressure resistant glass pipe by a 45° full-reflector 12 and a focusing lens 13. The black paint absorbs the laser energy to result in chain vaporization and ionization in the pipe, whereby a plasma cloud is formed. The intense shock wave embeds nanoparticles into the surface material of the workpiece to form a dense nanostructured coating, so that the overall corrosion resistance, abrasion resistance, oxidation resistance and fatigue life of the material are improved.

Embodiment 1

A pretreated 7050 aluminum alloy workpiece is fixed and clamped on the workpiece support plate 18; then, SiC nanopowders 22 are uniformly coated on a surface to be processed 15 of the 7050 aluminum alloy via the metal powder binder; the high pressure resistant glass pipe 21 is formed with a black paint strip on the inner wall and bottom of the upper opening, dried naturally and then clamped on the three-degree-of-freedom manipulator 9; the infrared locator 10 is turned on, and the manipulator is moved horizontally so that the infrared light irradiates on the black paint of the upper opening of the high pressure resistant glass pipe; then, the infrared locator is turned off, and the X/Y-axis workpiece support plate is moved so that the lower opening of the high pressure resistant glass pipe is aligned to a region to be processed; subsequently, the manipulator is moved vertically so that a distance from the lower opening to the surface to be processed is 10 mm; and finally, the workpiece support plate is fixed, and the manipulator is locked. A neodymium glass Q-switched laser device is activated, and the following basic parameters are set: laser pulse width: 10 ns; wavelength: 1.054 µm; pulse energy: 45 J; and, spot diameter: 12 mm. The laser beam with high power density and short pulse shocks the black paint 7 of the upper opening of the high pressure resistant glass pipe. The black paint is vaporized and ionized to generate a high-temperature and high-energy plasma. Then, the black paint plasma has chain explosion in the high pressure resistant glass pipe, whereby an intense explosion wave 5 (up to $10^3$-$10^5$ GPa) is formed at the lower opening. The intense explosion wave embeds the SiC nanopowders into the surface of the 7050 aluminum alloy. By moving the workpiece support plate, the nano-strengthening of the whole region to be processed is completed through multiple times of overlapping shock.

Embodiment 2

Figure 3:
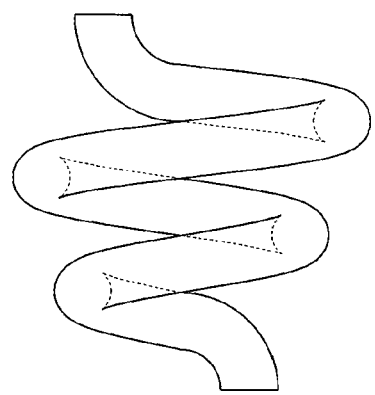
FIG. 3 is a schematic diagram showing a spiral and inverted conical high pressure resistant glass pipe.
Figure 4:
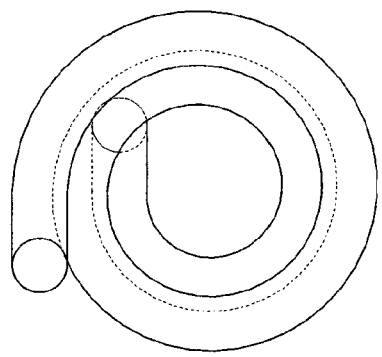
FIG. 4 is a top view of the spiral and inverted conical high pressure resistant glass pipe.

The high pressure resistant glass pipe for inducing a chain explosion may be in a spiral and inverted cone shape, as shown in FIG. 3 and FIG. 4. The pitch of the pipe is 20 mm. For the inner diameter of the spiral pipe, there may be a series of diameters (6 mm, 8 mm, 10 mm, etc.) depending on the laser spot. An upper end of the high pressure resistant glass pipe is closed, while a lower end thereof is open. The inner wall of the high pressure resistant glass pipe is a laser reflector and coated with the energy absorption material black paint. When a laser beam shocks the black paint at the upper opening, the black paint is vaporized and ionized to result in chain explosion in the pipe. The formed intense explosion wave is output from the lower opening to act on the surface to be processed of the workpiece.

Embodiment 3

Figure 5:
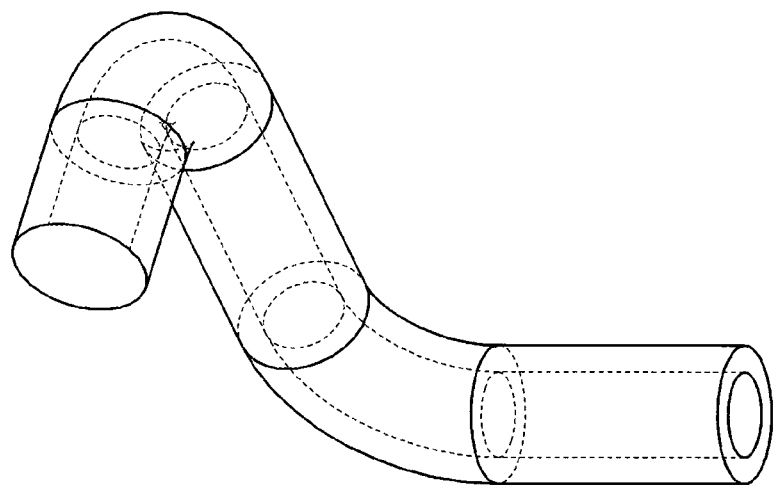
FIG. 5 is a schematic diagram showing a lateral surface glass pipe of a blocky workpiece.

The high pressure resistant glass pipe for inducing a chain explosion shock wave may be in a shape as shown in FIG. 5. The high pressure resistant glass pipe can horizontally output a shock wave induced by a vertical laser beam and is used for processing a lateral surface of a blocky workpiece. The inner diameter of the pipe varies according to the diameter of the laser spot. The diameter at a switchback location is 15 mm. The inner wall of the pipe is a laser reflective mirror coated with an energy absorption material. One end of the pipe is open, while the other end thereof is closed. The closed end, coated with the energy absorption material on the inside, receives laser irradiation to generate a plasma. The energy absorption material at the switchback locations may absorb the residual laser beam for vaporization and ionization to generate a plasma, thereby providing intermediate energy support and shock wave support for the chain explosion.

The invention claimed is:
1. A method comprising:
using a laser-induced continuous explosion shock wave to acquire a nanostructured coating, wherein a laser beam, having a power density in a level of GW/cm² and a laser pulse duration on a nanosecond level, is irradiated on a black paint surface of an upper opening of a pressure resistant glass pipe, a plurality of black paint particles of the black paint surface absorb the laser energy to result in an instantaneous vaporization, a breakdown and an ionization, and then generates a plasma;

radiating, by a subsequent laser beam to the laser beam, the plasma, which accumulates energy and initiates an expanding explosion to form an initial plasma explosion shock wave that is to be transmitted in the pressure resistant glass pipe, wherein plasma excites and induces adjacent plurality of black paint particles of the black paint surface to have the same process of instantaneous vaporization, ionization and expansion to a shock wave again;

wherein the method is repeated along a black paint strip to an end of the black paint strip, whereby a plasma cloud is formed, the explosion shock waves are superimposed layer upon layer, and the shock wave pressure reaching a lower opening of the pressure resistant glass pipe jumps;

wherein the shock wave pressure outputted from the lower opening of the pressure resistant glass pipe embeds nanoparticles on a surface of a pre-coated workpiece into the surface of the workpiece to form the nanostructured coating.

2. The method according to claim 1, comprising the following steps of:

derusting and polishing the surface to be treated of the workpiece with pieces of abrasive paper, and then deoiling and cleaning the workpiece with absolute alcohol;

installing the workpiece on a workpiece support plate capable of moving in the X-axis and Y-axis, and then clamping the workpiece;

uniformly coating nanopowders on the surface to be treated of the workpiece with a metal powder binder, and drying naturally;

forming a black paint particle strip on an inner wall and a bottom of the upper opening of the pressure resistant glass pipe via a flexible rubber tape with a cotton top, and drying naturally and then clamping the pressure resistant glass pipe on a three-degree-of-freedom manipulator;

turning an infrared locator on and moving the three-degree-of-freedom manipulator horizontally so that the infrared light irradiates on the black paint of the upper opening of the pressure resistant glass pipe;

then, moving the X/Y-axis workpiece support plate so that the lower opening of the pressure resistant glass pipe is aligned to a region to be processed; subsequently, moving the three-degree-of-freedom manipulator vertically so that a distance from the lower opening of the pressure resistant glass pipe to the surface to be processed is 3-5 mm; and finally, fixing the workpiece support plate, and locking the three-degree-of-freedom manipulator;

activating a laser device, setting a plurality of parameters, the plurality of parameters including power density of laser, spot diameter, energy and pulse width, and performing shock for three times;

performing single-point shock and overlapping shock at different positions by moving the workpiece support plate; and taking the workpiece down at the end of shock, and polishing and cleaning the workpiece.

* * * * *